(12) United States Patent  
Kuo et al.

(10) Patent No.: US 9,162,871 B1  
(45) Date of Patent: Oct. 20, 2015

(54) METAL MESH LID MEMS PACKAGE AND METHOD

(71) Applicant: Amkor Technology, Inc., Chandler, AZ (US)

(72) Inventors: Bob Shih-Wei Kuo, Chandler, AZ (US); Russell Shumway, Mesa, AZ (US); Louis B. Troche, Jr., Gilbert, AZ (US)

(73) Assignee: Amkor Technology, Inc., Tempe, AZ (US)

( * ) Notice: Subject to any disclaimer, the term of this patent is extended or adjusted under 35 U.S.C. 154(b) by 70 days.

(21) Appl. No.: 13/969,052

(22) Filed: Aug. 16, 2013

Related U.S. Application Data

(63) Continuation of application No. 13/096,359, filed on Apr. 28, 2011, now Pat. No. 8,536,663.

(51) Int. Cl.  
*H01L 29/84* (2006.01)  
*B81B 7/00* (2006.01)  
*B81C 1/00* (2006.01)

(52) U.S. Cl.  
CPC ............. *B81B 7/0032* (2013.01); *B81B 7/0061* (2013.01); *B81B 7/0074* (2013.01); *B81C 1/00261* (2013.01); *B81C 1/00269* (2013.01); *B81B 2207/09* (2013.01); *B81C 2203/01* (2013.01); *B81C 2203/0109* (2013.01); *B81C 2203/0154* (2013.01); *B81C 2203/0163* (2013.01)

(58) Field of Classification Search  
CPC .. B81B 7/0032; B81B 7/0061; B81B 7/0074; B81B 2207/09; B81C 1/00261; B81C 1/00269; B81C 2203/01; B81C 2203/0154; B81C 2203/0163; B81C 2203/0109  
See application file for complete search history.

(56) References Cited

U.S. PATENT DOCUMENTS

| | | | |
|---|---|---|---|
| 4,525,817 A | 6/1985 | Takuya | |
| 6,258,438 B1 | 7/2001 | Loveland et al. | |
| 6,522,762 B1 | 2/2003 | Mullenborn et al. | |
| 6,781,231 B2 | 8/2004 | Minervini | |
| 6,862,002 B2 | 3/2005 | Demicco et al. | |
| 7,132,307 B2 | 11/2006 | Wang et al. | |
| 7,166,910 B2 | 1/2007 | Minervini | |

(Continued)

FOREIGN PATENT DOCUMENTS

| | | |
|---|---|---|
| JP | 2000-307164 | 11/2000 |
| JP | 2002-057482 | 2/2002 |

(Continued)

OTHER PUBLICATIONS

Syed et al., "Top Port MEMS Microphone Package and Method," U.S. Appl. No. 12/834,682, filed Jul. 12, 2010.

(Continued)

*Primary Examiner* — Fei Fei Yeung Lopez  
(74) *Attorney, Agent, or Firm* — McAndrews, Held & Malloy

(57) ABSTRACT

A metal mesh lid MEMS package includes a substrate, a MEMS electronic component coupled to the substrate, and a metal mesh lid coupled to the substrate with a lid adhesive. The metal mesh lid includes a polymeric lid body having a top port formed therein and a metal mesh cap coupled to the lid body. The metal mesh cap covers the top port and serves as both a particulate filter and a continuous conductive shield for EMI/RF interferences. Further, the metal mesh cap provides a locking feature for the lid adhesive to maximize the attach strength of the metal mesh lid to the substrate.

20 Claims, 9 Drawing Sheets

(56) References Cited

U.S. PATENT DOCUMENTS

| | | | |
|---|---|---|---|
| 7,242,089 | B2 | 7/2007 | Minervini |
| 7,381,589 | B2 | 6/2008 | Minervini |
| 7,382,048 | B2 | 6/2008 | Minervini |
| 7,434,305 | B2 | 10/2008 | Minervini |
| 7,439,616 | B2 | 10/2008 | Minervini |
| 7,501,703 | B2 | 3/2009 | Minervini |
| 7,537,964 | B2 | 5/2009 | Minervini |
| 8,018,049 | B2 | 9/2011 | Minervini |
| 2003/0035558 | A1 | 2/2003 | Kawamura et al. |
| 2004/0046245 | A1* | 3/2004 | Minervini .................. 257/704 |
| 2004/0184632 | A1 | 9/2004 | Minervini |
| 2006/0157841 | A1 | 7/2006 | Minervini |
| 2007/0082421 | A1 | 4/2007 | Minervini |
| 2007/0176272 | A1* | 8/2007 | Saitoh et al. ................ 257/679 |
| 2007/0201715 | A1 | 8/2007 | Minervini |
| 2007/0202627 | A1 | 8/2007 | Minervini |
| 2007/0215962 | A1 | 9/2007 | Minervini et al. |
| 2008/0150111 | A1 | 6/2008 | Hiller et al. |
| 2009/0057876 | A1 | 3/2009 | Chien et al. |
| 2009/0184403 | A1 | 7/2009 | Wang et al. |
| 2010/0119097 | A1 | 5/2010 | Ohtsuka |
| 2010/0142325 | A1* | 6/2010 | Altman et al. ................ 367/118 |
| 2010/0142743 | A1* | 6/2010 | Tanaka et al. ................ 381/346 |

FOREIGN PATENT DOCUMENTS

| | | |
|---|---|---|
| JP | 2010-187277 | 8/2010 |
| WO | WO 2009/022459 | 2/2009 |

OTHER PUBLICATIONS

Miks et al., "Top Port with Interposer MEMS Microphone Package and Method," U.S. Appl. No. 13/016,343, filed Jan. 28, 2011.

Kuo et al., "Stacked and Staggered Die MEMS Package and Method," U.S. Appl. No. 13/046,071, filed Mar. 11, 2011.

Kuo et al., "Metal Mesh Lid MEMS Package and Method," U.S. Appl. No. 13/096,359, filed Apr. 28, 2011.

Gabriel, K., "Akustica", Sep. 29, 2005, 46 pages, Akustica, Inc., Pittsburgh, PA, USA.

"Infineon®-SMM310™ Silicon MEMS Microphone", Product Brief, 2007, 2 pages, Infineon Technologies AG, Munich, Germany. No author provided.

"Surface Mount MEMS Microphones", 2 pages. Retrieved on Apr. 28, 2010 from the Internet: <URL:http://www.knowles.com/search/product.htm?x_sub_cat_id=3>. No author provided.

\* cited by examiner

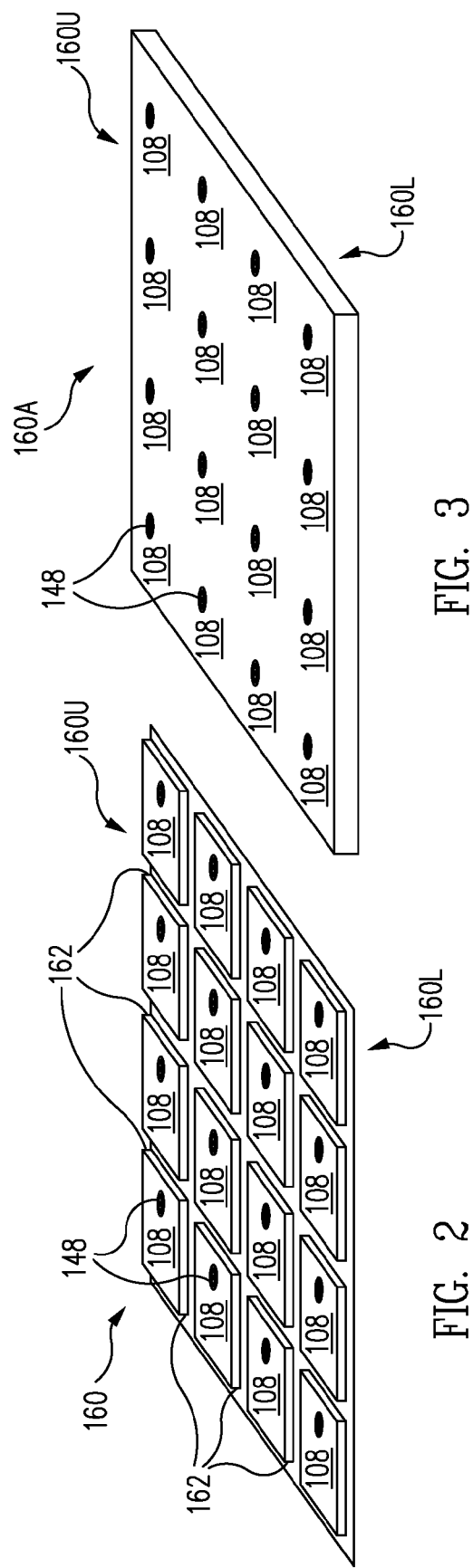

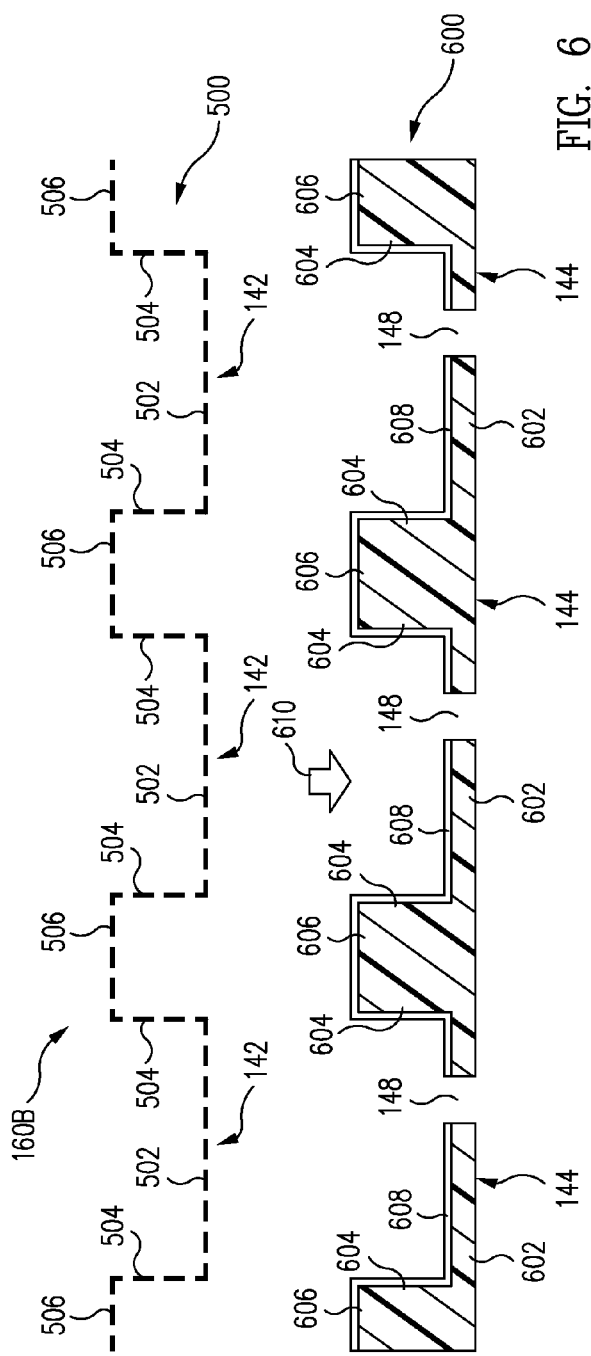
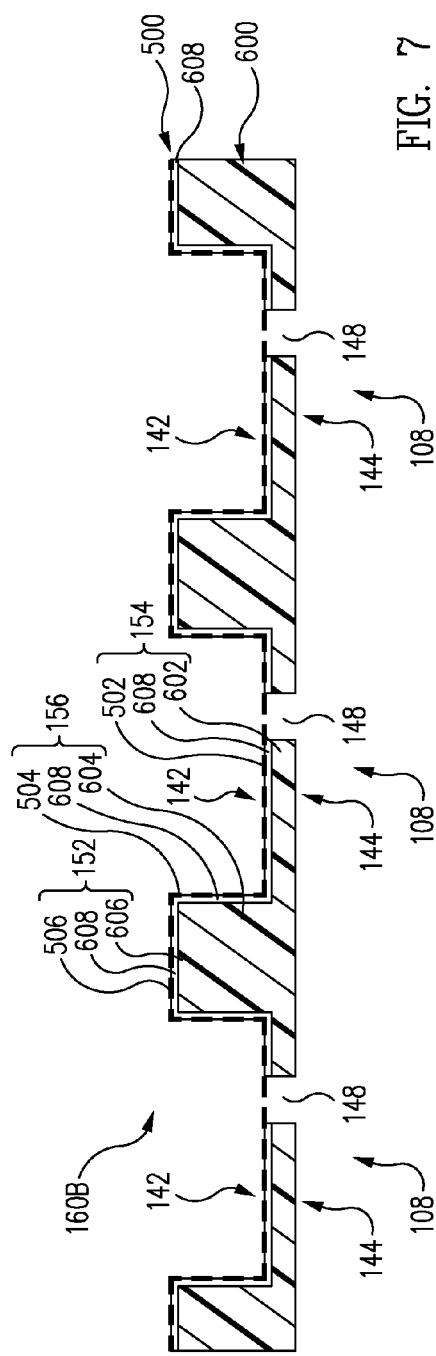

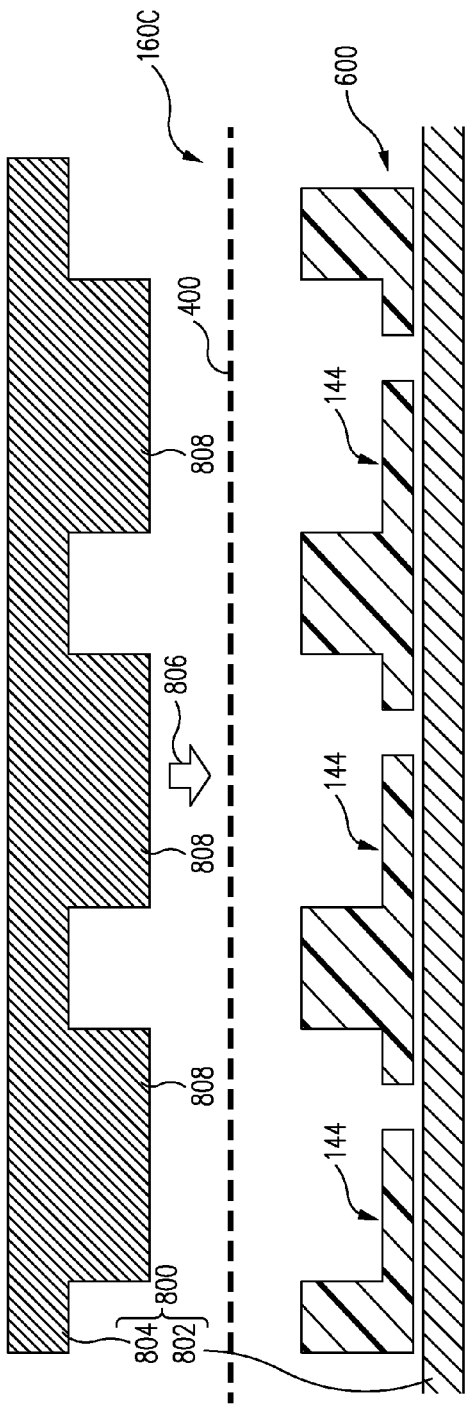
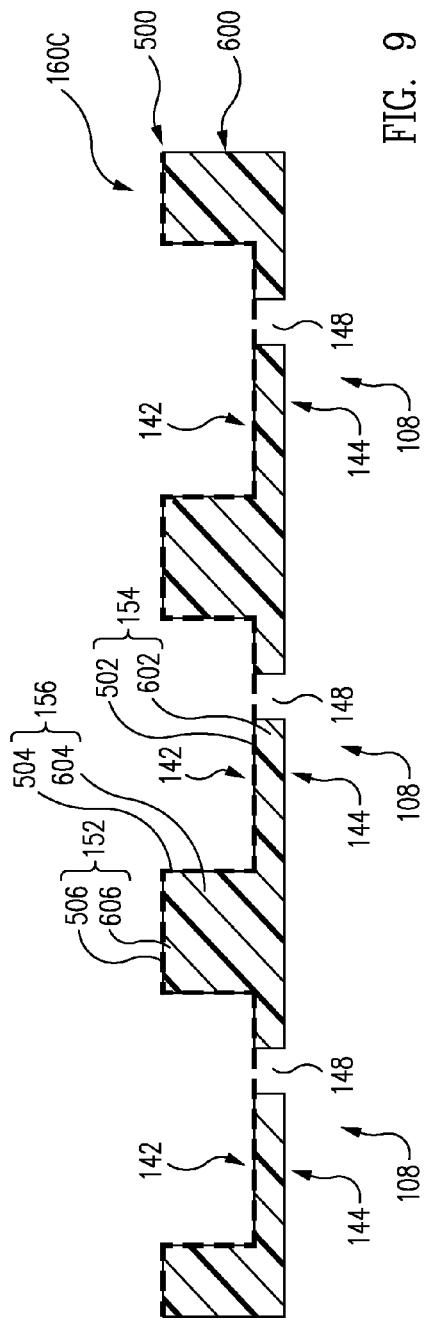

METAL MESH LID MEMS PACKAGE AND METHOD

RELATED APPLICATIONS

This application is a continuation of Kuo et al., U.S. patent application Ser. No. 13/096,359, filed on Apr. 28, 2011, entitled "METAL MESH LID MEMS PACKAGE AND METHOD", which is herein incorporated by reference in its entirety.

TECHNICAL FIELD

The present application relates to the field of electronics, and more particularly, to methods of forming electronic component packages and related structures.

BACKGROUND

A Micro Electro Mechanical Systems (MEMS) package typically includes a MEMS sensor die, sometimes called a MEMS electronic component. As the MEMS sensor die receives external stimulus such as sound waves or pneumatic pressure, the variations in the stimulus signals are converted to electrical signals.

The MEMS sensor die is typically covered with a lid to protect the MEMS sensor die. To allow the MEMS sensor die to receive external stimulus, a port is formed in the lid to provide access to the ambient environment. However, the MEMS sensor die can get contaminated by airborne particulates passing through the port thus damaging or destroying the MEMS sensor die.

BRIEF DESCRIPTION OF THE DRAWINGS

FIG. 2 is a top perspective view of a metal mesh lid array of the array of FIG. 1 in accordance with one embodiment;

FIG. 3 is top perspective view of a metal mesh lid array in accordance with another embodiment;

FIG. 6 is a cross-sectional view of a metal mesh lid array during fabrication with the metal mesh cap array of FIG. 5 in accordance with one embodiment;

FIG. 7 is a cross-sectional view of the metal mesh lid array of FIG. 6 after fabrication in accordance with one embodiment;

FIG. 8 is a cross-sectional view of a metal mesh lid array during fabrication with the metal mesh sheet of FIG. 4 in accordance with one embodiment;

FIG. 9 is a cross-sectional view of the metal mesh lid array of FIG. 8 after fabrication in accordance with one embodiment;

In the following description, the same or similar elements are labeled with the same or similar reference numbers.

DETAILED DESCRIPTION

Figure 1:
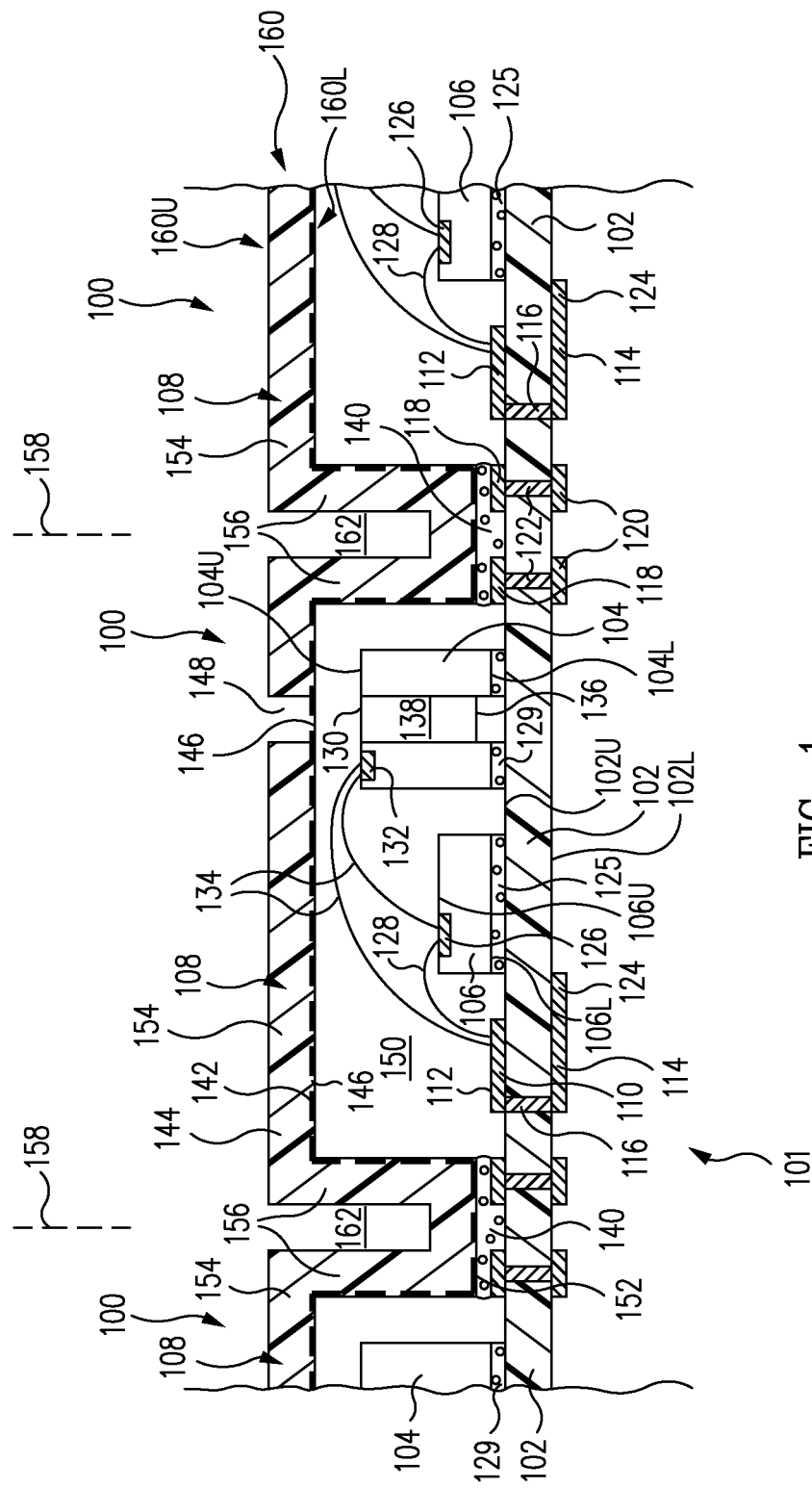
FIG. 1 is a cross-sectional view of an array of metal mesh lid MEMS packages during fabrication in accordance with one embodiment.

As an overview and in accordance with one embodiment, referring to FIG. 1, a metal mesh lid MEMS package 100 includes a substrate 102, a MEMS electronic component 104 coupled to substrate 102, and a metal mesh lid 108 coupled to substrate 102 with a lid adhesive 140. Metal mesh lid 108 includes a lid body 144, e.g., formed of a polymeric material, having a top port 148 formed therein and a metal mesh cap 142 coupled to lid body 144.

Metal mesh cap 142 covers top port 148. Accordingly, metal mesh cap 142 serves as both a particulate filter over the open top port 148, as well as a continuous conductive shield for EMI/RF interferences. Metal mesh cap 142 also provides an acoustic impedance control through selecting the appropriate mesh sizing. Further, metal mesh cap 142 also provides a locking feature for lid adhesive 140 to maximize the attach strength of metal mesh lid 108 to substrate 102.

Now in more detail, FIG. 1 is a cross-sectional view of an array 101 of metal mesh lid Micro Electro Mechanical Systems (MEMS) packages 100 during fabrication in accordance with one embodiment. Each metal mesh lid MEMS package 100 includes a substrate 102, a MEMS electronic component 104, a converter electronic component 106, and a metal mesh lid 108. For simplicity, a single metal mesh lid MEMS package 100 is described below and those of skill in the art will understand that the description is equally applicable to all of the metal mesh lid MEMS packages 100 of array 101.

Substrate 102 includes a dielectric material such as laminate, ceramic, printed circuit board material, or other dielectric material. Formed on an upper, e.g., first, surface 102U of substrate 102 are electrically conductive upper, e.g., first, terminals 110, e.g., formed of copper. Substrate 102 further includes a lower, e.g., second, surface 102L.

Substrate 102 further includes upper, e.g., first, traces 112 formed at upper surface 102U and lower, e.g., second, traces 114 formed at lower surface 102L. Lower traces 114 are electrically connected to upper traces 112 by electrically conductive vias 116 extending through substrate 102 between upper surface 102U and lower surface 102L.

Substrate 102 further includes upper ground terminals 118 formed at upper surface 102U and lower ground lands 120 formed at lower surface 102L. Lower ground lands 120 are electrically connected to upper ground terminals 118 by electrically conductive ground vias 122 extending through substrate 102 between upper surface 102U and lower surface 102L.

Substrate 102 can further include an upper, e.g., first, solder mask at upper surface 102U that protects first portions of upper traces 112 while exposing second portions, e.g., upper terminals 110, of upper traces 112 and exposing upper ground terminals 118. Substrate 102 can further include a lower, e.g., second, solder mask at lower surface 102L that protects first portions of lower traces 114 while exposing second portions, e.g., lands 124, of lower traces 114 and exposing lower ground lands 120.

In one embodiment, lands 120, 124 are distributed in an array thus forming a Land Grid Array (LGA). Alternatively, interconnection balls, e.g., solder balls, are formed on lands 120, 124 thus forming a Ball Grid Array (BGA).

Although a particular electrically conductive pathway is described above, other electrically conductive pathways can be formed. For example, contact metallizations can be formed between the various electrical conductors.

Further, instead of straight though vias 116, 122, in one embodiment, substrate 102 is a multilayer substrate and a plurality of vias and/or internal traces form the electrical interconnection between upper traces 112 and lower traces 114 and between upper ground terminals 118 and lower ground lands 120.

Converter electronic component 106 is a conventional converter electronic component, sometimes called an Application Specific Integrated Circuit (ASIC) chip. Accordingly, the features and functions of converter electronic component 106 are well known to those of skill in the art. Thus, only a general description of various features and functions of converter electronic component 106 are set forth below. Generally, converter electronic component 106 converts the signals(s) from MEMS electronic component 104 as required for the particular application.

Converter electronic component 106 includes an active, e.g., first, surface 106U and an opposite inactive, e.g., second, surface 106L. Lower surface 106L is mounted to upper surface 102U of substrate 102 with an adhesive 125. Active surface 106U includes bond pads 126.

Bond pads 126 of converter electronic component 106 are electrically connected to respective upper terminals 110 with electrically conductive bond wires 128.

In accordance with another embodiment, converter electronic component 106 is mounted in a flip chip configuration. Illustratively, flip chip bumps, e.g., solder, forms the physical and electrical interconnection between bond pads 126 of converter electronic component 106 and upper terminals 110 of upper traces 112. Optionally, an underfill is applied between converter electronic component 106 and substrate 102.

In accordance with yet another embodiment, metal mesh lid MEMS microphone package 100 is formed without converter electronic component 106. Illustratively, the functionality of converter electronic component 106 is incorporated into MEMS electronic component 104. Accordingly, a separate converter electronic component 106 is unnecessary and not provided.

MEMS electronic component 104 is a conventional MEMS microphone electronic component, sometimes called a MEMS chip. Accordingly, the features and functions of MEMS electronic component 104 are well known to those of skill in the art. Thus, only a general description of various features and functions of MEMS electronic component 104 are set forth below. In this embodiment, MEMS electronic component 104 is an acoustical microphone although can be another type of MEMS electronic component such as a pressure sensor as discussed further below.

MEMS electronic component 104 includes a lower, e.g., first, surface 104L and an opposite upper, e.g., second, surface 104U. Lower surface 104L is mounted to upper surface 102U of substrate 102 with an adhesive 129. MEMS electronic component 104 further includes a moveable compliant diaphragm 130 and bond pads 132 formed at upper surface 104U. Bond pads 132 are electrically connected to respective upper terminals 110 with electrically conductive bond wires 134.

Optionally, one or more of bond pads 132 of MEMS electronic component 104 are electrically connected to respective one or more bond pads 126 of converter electronic component 106 with bond wires 134. Accordingly, bond pads 132 of MEMS electronic component 104 are electrically connected to respective upper terminals 110, to respective bond pads 126 of converter electronic component 106, or to both respective upper terminals 110 and respective bond pads 126 of converter electronic component 106.

MEMS electronic component 104 further includes a rigid perforated backplate 136 at lower surface 104L. MEMS electronic component 104 further includes an aperture 138 extending through MEMS electronic component 104 and between upper surface 104U and lower surface 104L. More particularly, aperture 138 extends between and separates diaphragm 130 and backplate 136 such that diaphragm 130 and backplate 136 form a capacitor.

As described further below, during operation, sound waves (or pressure waves in other embodiments) move diaphragm 130 thus causing changes in the capacitance between diaphragm 130 and backplate 136. An electrical signal corresponding to the capacitance variations is output on bond pads 132.

MEMS electronic component 104 and converter electronic component 106 are enclosed within metal mesh lid 108. Metal mesh lid 108 includes a metal mesh cap 142 and a lid body 144.

Metal mesh cap 142 is a semi-permeable barrier made of connected strands of metal or other electrically conductive material, e.g., is a metal mesh. Metal mesh cap 142 includes a plurality of small holes 146 through which external stimulus can pass. More particularly, metal mesh cap 142 is permeable to sound and pressure, i.e., sound waves and pneumatic pressure can pass through metal mesh cap 142.

Lid body 144 is formed of a metal mesh sealing material. Illustratively, lid body 144 is a dielectric material, e.g., is molding compound, encapsulant, adhesive, a polymeric material, or other material that can seal small holes 146 in metal mesh cap 142. In other embodiments, lid body 144 is an electrically conductive material, e.g., is silver paint, electrically conductive adhesive, or other material that can seal small holes 146 in metal mesh cap 142.

Generally, lid body 144 is a complete barrier to sound and pressure, i.e., sound waves and pneumatic pressure cannot pass directly through lid body 144.

Metal mesh lid 108 further includes a top port 148. Top port 148 is an aperture, sometimes called an opening or hole, extending through metal mesh lid 108. More particularly, top port 148 is an aperture within lid body 144. However, top port 148 is covered by metal mesh cap 142.

More particularly, top port 148 is in fluid communication with a lid cavity 150 of metal mesh lid 108 and thus diaphragm 130 of MEMS electronic component 104 located within lid cavity 150. As used herein, regions are in fluid communication when they are directly connected to one another without an intervening structure such that fluid, e.g., air, and sound can freely move from one region to the other.

Accordingly, during use, sound travels through top port 148, passes through small holes 146 in metal mesh cap 142, through lid cavity 150 and moves diaphragm 130. As described above, the motion of diaphragm 130 from the sound is converted into an electrical signal that is output on bond pads 132, e.g., through various conductors such as bond pads, interconnects, output pads and/or lead terminals.

As set forth above, top port 148 is covered with metal mesh cap 142. Metal mesh cap 142 is a filter, sometimes called a filtration structure, that prevents dust, airborne particulates, and other contaminates from passing through top port 148 and entering into lid cavity 150. In this manner, dust, airborne particulates, and other contamination are prevented from damaging or destroying MEMS electronic component 104.

Further, through mesh size selection, i.e., through selecting the size of holes 146 of metal mesh cap 142, the size of foreign materials allowed to pass through metal mesh cap 142 is controlled thereby preventing selective size ranges of damaging particles from passing through top port 148. In addition, through mesh size selection along with selection of the diameter of top port 148, acoustic impedance and the resulting performance of MEMS electronic component 104 is controlled for a given application.

Further, top port 148 allows venting and escape of expansive pressure during formation of metal mesh lid MEMS package 100, e.g., during sealing of metal mesh lid 108 to substrate 102.

Further, metal mesh cap 142 is formed of an electrically conductive material to provide Radio Frequency (RF) shielding or more generally to provide shielding from ElectroMagnetic Interference (EMI). Metal mesh cap 142 is exposed at a lid base 152 of metal mesh lid 108.

More particularly, metal mesh lid 108 includes a lid plate 154 parallel to substrate 102, lid sidewalls 156 extending perpendicularly downward from lid plate 154 and terminating at lid base 152. Lid plate 154 has top port 148 formed therein. Lid base 152 is a rectangular annulus parallel to upper surface 102U of substrate 102. Although the terms parallel, perpendicular, and similar terms are used herein, it is to be understood that the described features may not be exactly parallel and perpendicular, but only substantially parallel and perpendicular to within excepted manufacturing tolerances.

As set forth above, metal mesh cap 142 is exposed at lid base 152. Lid adhesive 140 bonds lid base 152 and thus metal mesh cap 142 to the outer periphery of upper surface 102U of substrate 102. As the surface area of metal mesh cap 142 in contact with lid adhesive 140 is maximized as compared to a flat surface, metal mesh cap 142 enhances bonding of metal mesh lid 108 to substrate 102.

Further, in accordance with this embodiment, lid adhesive 140 is electrically conductive, e.g., is an electrically conductive epoxy, solder, or other electrically conductive adhesive. Metal mesh lid 108 is mounted to and electrically connected by lid adhesive 140 to upper surface 102U of substrate 102 including upper ground terminals 118 exposed thereon.

In one embodiment, a reference voltage source, e.g., ground, is provided to upper ground terminals 118 and thus metal mesh lid 108 during operation. Illustratively, lower ground land 120 are coupled to the reference voltage source, e.g., ground, which is thus coupled to upper ground terminals 118, lid adhesive 140, and metal mesh cap 142 of metal mesh lid 108. Stated another way, lower ground lands 120 are grounded thus grounding upper ground terminals 118, lid adhesive 140, and metal mesh lid 108.

Thus, as set forth above, metal mesh cap 142 serves as both a particulate filter over the open top port 148, as well as a continuous conductive shield for EMI/RF interferences. Metal mesh cap 142 also provides a locking feature for lid adhesive 140 to maximize metal mesh lid 108 attach strength.

Although MEMS electronic component 104 is described above as a MEMS microphone, in other embodiments, MEMS electronic component 104 is another type of MEMS device. For example, MEMS electronic component 104 is a pressure sensor or other MEMS electronic component where access to the ambient environment is required or desired.

After fabrication of the plurality of metal mesh lid MEMS packages 100, array 101 is singulated along singulation streets 158, e.g., using a saw, laser, or other singulation technique, to form a plurality of individual metal mesh lid MEMS packages 100. Although metal mesh lid MEMS packages 100 are set forth above as being formed simultaneously in array 101, in another embodiment, metal mesh lid MEMS packages 100 are formed individually.

FIG. 2 is a top perspective view of a metal mesh lid array 160 of array 101 of FIG. 1 in accordance with one embodiment. Referring now to FIGS. 1 and 2 together, metal mesh lid array 160 includes metal mesh lids 108 integrally connected together. Although a 4×4 array of metal mesh lids 108 is illustrated in FIG. 2, generally metal mesh lid array 200 includes an N×M array or strip of metal mesh lids 108 for use in forming an N×M array or strip of metal mesh lid MEMS packages 100.

Metal mesh lid array 160 includes an upper, e.g., first, surface 160U and an opposite lower, e.g., second, surface 160L. Lower surface 160L is mounted to substrates 102 by lid adhesives 140.

Gaps 162, e.g., in a criss-cross pattern, are formed in upper surface 160U between adjacent metal mesh lids 108, e.g., to facilitate singulation of metal mesh lid MEMS packages 100.

FIG. 3 is top perspective view of a metal mesh lid array 160A in accordance with another embodiment. Metal mesh lid array 160A of FIG. 3 is similar to metal mesh lid array 160 of FIG. 2 except that gaps 162 (see FIGS. 1, 2) are not formed but are filled with lid body 144 in accordance with the embodiment illustrated in FIG. 3. Accordingly, upper surface 160U of metal mesh lid array 160A of FIG. 3 is a continuous flat plane having top ports 148 formed therein.

Figure 4:
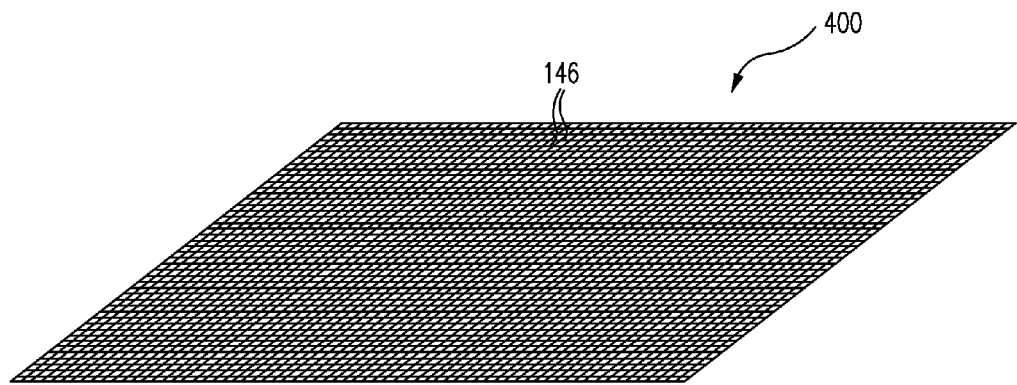
FIG. 4 is a perspective view of a metal mesh sheet for use in forming a metal mesh lid array in accordance with one embodiment.

FIG. 4 is a perspective view of a metal mesh sheet 400 for use in forming a metal mesh lid array in accordance with one embodiment. Metal mesh sheet 400 is a sheet of metal mesh having small holes 146 formed therein. Metal mesh sheet 400 is sometimes called a fine mesh.

Generally, small holes 146 are sufficiently large to allow sound or other desired stimulus to pass through metal mesh sheet 400. However, small holes 146 are sufficiently small to prevent dust, airborne particulates, or other contaminants from passing through metal mesh sheet 400 and to provide sufficient EMI shielding.

Figure 5:
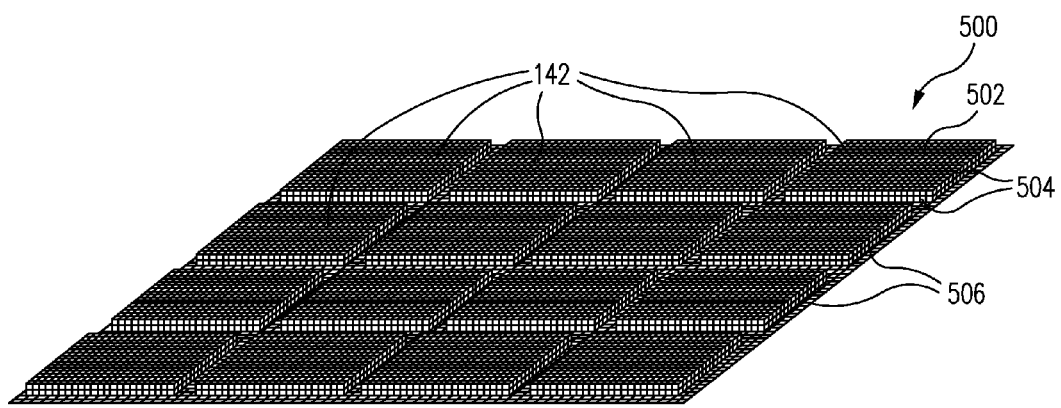
FIG. 5 is a perspective view of a metal mesh cap array formed from the metal mesh sheet of FIG. 4 in accordance with one embodiment.

FIG. 5 is a perspective view of a metal mesh cap array 500 formed from metal mesh sheet 400 of FIG. 4 in accordance with one embodiment. Referring to FIGS. 4 and 5 together, metal mesh sheet 400 is shaped from the flat sheet of FIG. 4 into metal mesh cap array 500 as illustrated in FIG. 5. Illustratively, metal mesh sheet 400 is shaped by being pressed into a form or using other mechanical shaping techniques to form metal mesh cap array 500 as illustrated in FIG. 5. Metal mesh cap array 500 is sometimes called a pre-formed mesh array.

Referring now to FIG. 5, metal mesh cap array 500 includes a plurality of metal mesh caps 142 integrally connected together. Each metal mesh cap 142 includes a metal mesh cap plate 502, metal mesh cap sidewalls 504 extending perpendicularly downward from metal mesh cap plate 502 and terminating at a metal mesh cap base 506.

FIG. 6 is a cross-sectional view of a metal mesh lid array 160B during fabrication with metal mesh cap array 500 of FIG. 5 in accordance with one embodiment. Note that metal mesh cap array 500 is inverted (upside down) in the view of FIG. 6 as compared to the view in FIG. 5.

Referring now to FIG. 6, a lid body array 600 is formed, e.g., by molding or other technique. Lid body array 600 includes a plurality of lid bodies 144 integrally connected together. Lid body array 600 is sometimes called a lid array.

Each lid body 144 includes a lid body plate 602 having a top port 148 formed therein. Each lid body 144 further includes lid body sidewalls 604 extending perpendicularly from lid body plate 602 and terminating at a lid body base 606.

Each lid body 144 corresponds in shape to the respective metal mesh cap 142. More generally, lid body array 600 corresponds in shape to metal mesh cap array 500 allowing metal mesh cap array 500 to be bonded to lid body array 600.

A metal mesh cap bonding material 608 is applied to lid body array 600 and more particularly to lid body plates 602, lid body sidewalls 604, and lid body bases 606. Metal mesh cap bonding material 608 is an adhesive material, e.g., epoxy.

Metal mesh cap array 500 is moved as indicated by the arrow 610 into contact with metal mesh cap bonding material 608 and thus bonded to lid body array 600 to form metal mesh lid array 160B as illustrated in FIG. 7. In one embodiment, metal mesh cap array 500 is held in place as metal mesh cap bonding material 608 cures.

FIG. 7 is a cross-sectional view of metal mesh lid array 160B of FIG. 6 after fabrication in accordance with one embodiment. As illustrated in FIG. 7, metal mesh lid array 160B includes metal mesh caps 142 bonded to lid bodies 144 by metal mesh cap bonding material 608 to form metal mesh lids 108. Top ports 148 extend through lid bodies 144 yet are covered by metal mesh caps 142.

Metal mesh cap plates 502 and lid body plates 602 including metal mesh cap bonding material 608 therebetween collectively define lid plates 154 of metal mesh lids 108. Metal mesh cap sidewalls 504 and lid body sidewalls 604 including metal mesh cap bonding material 608 therebetween collectively define lid sidewalls 156 of metal mesh lids 108. Metal mesh cap bases 506 and lid body bases 606 including metal mesh cap bonding material 608 therebetween collectively define lid bases 152 of metal mesh lids 108.

FIG. 8 is a cross-sectional view of a metal mesh lid array 160C during fabrication with metal mesh sheet 400 of FIG. 4 in accordance with one embodiment. Referring now to FIG. 8, lid body array 600 is placed within a hot forming press 800. Lid body array 600 is described above regarding FIGS. 6, 7 and so the description thereof is not repeated here for simplicity.

More particularly, lid body array 600 is placed on and supported by a lower hot press plate 802 of hot forming press 800. Metal mesh sheet 400 is placed above lid body array 600 as illustrated in FIG. 8. An upper hot press plate 804 of hot forming press 800 is moved as indicated by the direction of arrow 806 to simultaneously shape metal mesh sheet 400 into metal mesh cap array 500 while simultaneously bonding metal mesh cap array 500 to lid body array 600.

More particularly, upper hot press plate 804 includes a plurality of metal mesh cap shaping forms 808 protruding downward from upper hot press plate 804. Metal mesh cap shaping forms 808 correspond in shape with lid bodies 144 of lid body array 600.

Metal mesh cap shaping forms 808 press metal mesh sheet 400 into lid bodies 144 of lid body array 600. In one embodiment, hot forming press 800 is heated. Due to the heat and pressure, metal mesh sheet 400 is shaped into metal mesh cap array 500. At the same time, due to the heat and pressure, lid body array 600 is deformed, e.g., slightly liquefied, to bond to metal mesh cap array 500 to form metal mesh lid array 160C as illustrated in FIG. 9.

FIG. 9 is a cross-sectional view of metal mesh lid array 160C of FIG. 8 after fabrication in accordance with one embodiment. As illustrated in FIG. 9, metal mesh lid array 160C includes metal mesh caps 142 directly bonded to lid bodies 144 to form metal mesh lids 108. Top ports 148 extend through lid bodies 144 yet are covered by metal mesh caps 142.

Metal mesh cap plates 502 and lid body plates 602 collectively define lid plates 154 of metal mesh lids 108. Metal mesh cap sidewalls 504 and lid body sidewalls 604 collectively define lid sidewalls 156 of metal mesh lids 108. Metal mesh cap bases 506 and lid body bases 606 collectively define lid bases 152 of metal mesh lids 108.

Figure 10:
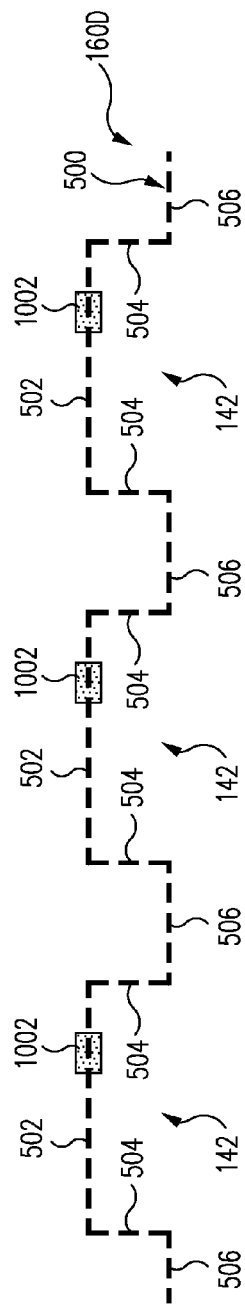
FIG. 10 is a cross-sectional view of a metal mesh lid array during fabrication with the metal mesh cap array of FIG. 5 in accordance with one embodiment.

FIG. 10 is a cross-sectional view of a metal mesh lid array 160D during fabrication with metal mesh cap array 500 of FIG. 5 in accordance with one embodiment. Referring now to FIG. 10, top port plugs 1002 are formed in metal mesh cap plates 502 of metal mesh caps 142. Top port plugs 1002 are formed in top port hole areas corresponding to the final location of top ports 148 as described further below. Illustratively, top port plugs 1002 are formed of a removable material such as wax.

Figure 11:
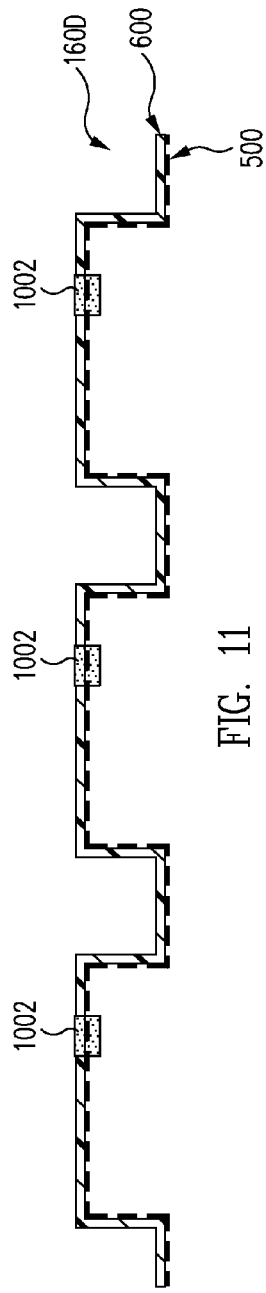
FIG. 11 is a cross-sectional view of the metal mesh lid array of FIG. 10 at a later stage during fabrication in accordance with one embodiment.

FIG. 11 is a cross-sectional view of metal mesh lid array 160D of FIG. 10 at a later stage during fabrication in accordance with one embodiment. Referring now to FIG. 11, lid body array 600 is formed on metal mesh cap array 500.

In one embodiment, lid body array 600 is a sealed shell formed on metal mesh cap array 500. In various embodiments, lid body array 600 is formed by spraying or printing a material such as silver paint or epoxy on metal mesh cap array 500. In another embodiment, lid body array 600 is formed by dipping metal mesh cap array 500 into a material such as silver paint or epoxy.

In one embodiment, lid body array 600 covers top port plugs 1002. However, in another embodiment, top port plugs 1002 are not covered by lid body array 600. For example, top port plugs 1002 are not wettable by the material of lid body array 600 and thus are not covered.

Figure 12:
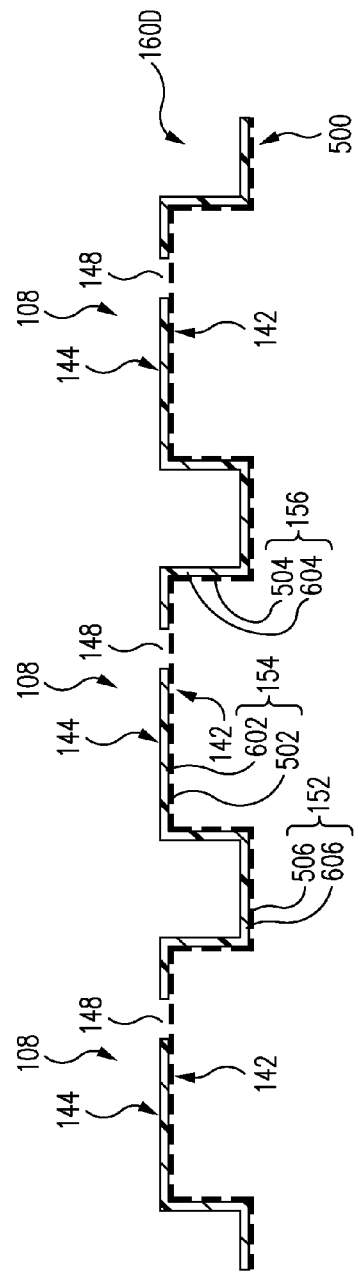
FIG. 12 is a cross-sectional view of the metal mesh lid array of FIG. 11 at a later stage during fabrication in accordance with one embodiment.

FIG. 12 is a cross-sectional view of metal mesh lid array 160D of FIG. 11 at a later stage during fabrication in accordance with one embodiment. Referring now to FIGS. 11 and 12 together, top port plugs 1002 and any of lid body array 600 formed thereon are removed to form top ports 148.

In one embodiment, top port plugs 1002 are removed by heating metal mesh lid array 160D to melt top port plugs 1002. In another embodiment, top port plugs 1002 are removed by chemical etching or other removal technique.

As illustrated in FIG. 12, metal mesh lid array 160D includes metal mesh caps 142 directly bonded to lid bodies 144 to form metal mesh lids 108. Top ports 148 extend through lid bodies 144 yet are covered by metal mesh caps 142.

Metal mesh cap plates 502 and lid body plates 602 collectively define lid plates 154 of metal mesh lids 108. Metal mesh cap sidewalls 504 and lid body sidewalls 604 collectively define lid sidewalls 156 of metal mesh lids 108. Metal mesh cap bases 506 and lid body bases 606 collectively define lid bases 152 of metal mesh lids 108.

Figure 13:
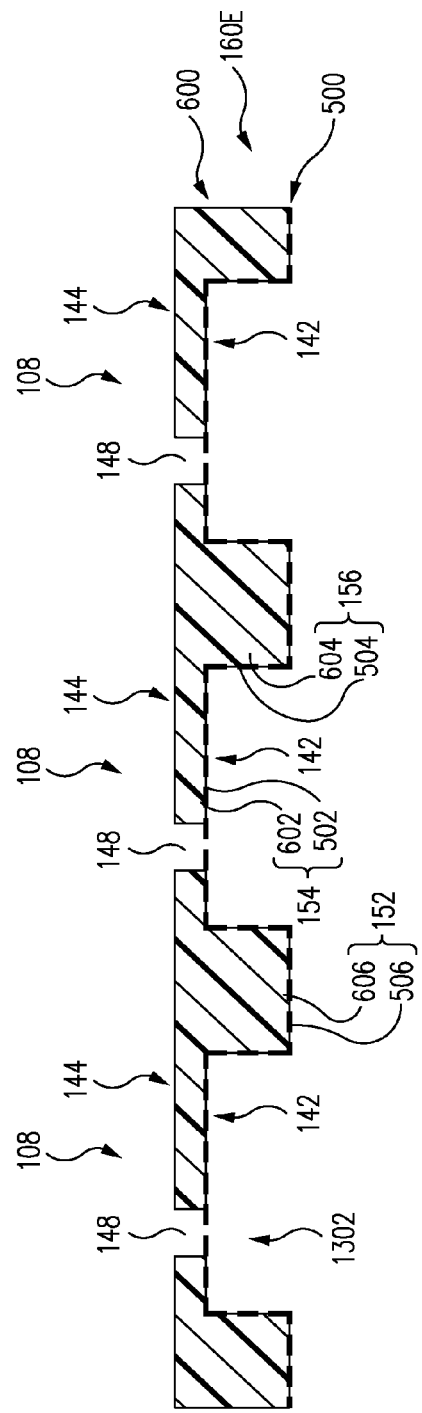
FIG. 13 is a cross-sectional view of a metal mesh lid array formed with the metal mesh cap array of FIG. 5 in accordance with one embodiment.

FIG. 13 is a cross-sectional view of a metal mesh lid array 160E formed with metal mesh cap array 500 of FIG. 5 in accordance with one embodiment. Referring now to FIG. 13, lid body array 600 is molded to metal mesh cap array 500. Illustratively, metal mesh cap array 500 is insert molded, e.g., is placed inside of an injection mold, material of lid body array 600, e.g., Liquid Crystal Polymer (LCP) or other high temperature polymer, is injected into the injection mold around metal mesh cap array 500, followed by removal of metal mesh lid array 160E from the injection mold.

As illustrated in FIG. 13, metal mesh lid array 160E includes metal mesh caps 142 directly bonded to lid bodies 144 to form metal mesh lids 108. Top ports 148 extend through lid bodies 144 yet are covered by metal mesh caps 142. Metal mesh cap plates 502 and lid body plates 602 collectively define lid plates 154 of metal mesh lids 108. Metal mesh cap sidewalls 504 and lid body sidewalls 604 collectively define lid sidewalls 156 of metal mesh lids 108. Metal mesh cap bases 506 and lid body bases 606 collectively define lid bases 152 of metal mesh lids 108.

As illustrated in FIG. 13, metal mesh cap array 500 is at or near the inner surface 1302 of lid body array 600. However, in another embodiment such as that illustrated in FIG. 14, metal mesh cap array 500 is embedded within lid body array 600.

Figure 14:
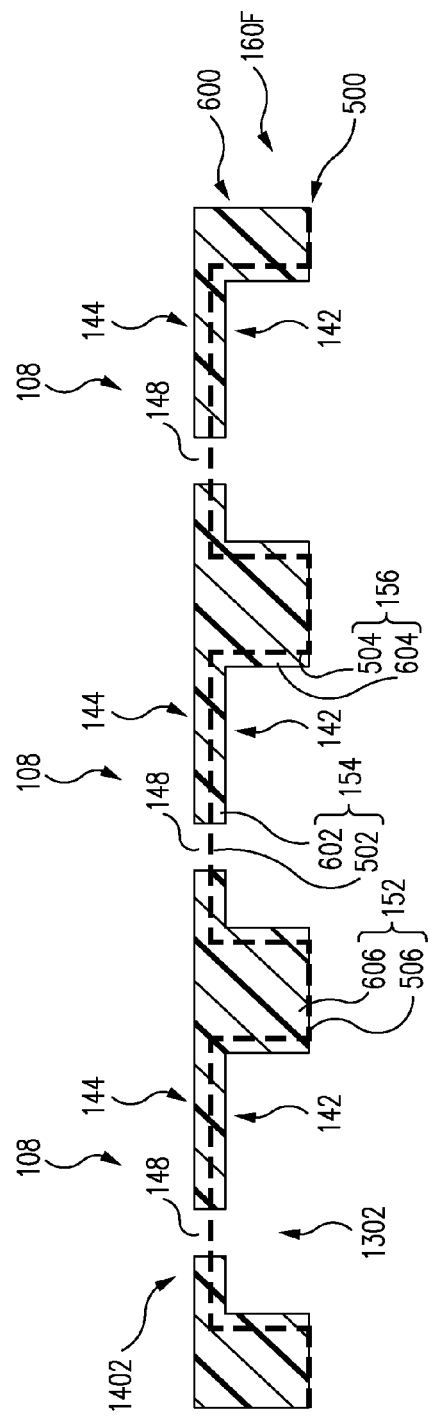
FIG. 14 is a cross-sectional view of a metal mesh lid array formed with the metal mesh cap array of FIG. 5 in accordance with one embodiment.

FIG. 14 is a cross-sectional view of a metal mesh lid array 160F formed with metal mesh cap array 500 of FIG. 5 in accordance with one embodiment. Referring now to FIG. 14, lid body array 600 is molded to metal mesh cap array 500 in a manner similar to that described above regarding FIG. 13.

As illustrated in FIG. 14, metal mesh lid array 160F includes metal mesh caps 142 directly bonded to lid bodies 144 to form metal mesh lids 108. Top ports 148 extend through lid bodies 144 yet are covered by metal mesh caps 142. Metal mesh cap plates 502 and lid body plates 602 collectively define lid plates 154 of metal mesh lids 108. Metal mesh cap sidewalls 504 and lid body sidewalls 604 collectively define lid sidewalls 156 of metal mesh lids 108. Metal mesh cap bases 506 and lid body bases 606 collectively define lid bases 152 of metal mesh lids 108.

However, in accordance with this embodiment, metal mesh cap array 500 is embedded within lid body array 600. More particularly, lid body array 600 exists between inner surface 1302 of lid body array 600 and metal mesh cap array 500. Further, lid body array 600 exists between an outer surface 1402 of lid body array 600 and metal mesh cap array 500.

However, metal mesh cap bases 506 are exposed from lid body bases 606. This facilitates formation of electrical interconnection with metal mesh cap bases 506 and thus metal mesh caps 142, e.g., for grounding.

Thus, as set forth above in regards to FIG. 6-14, metal mesh cap array 500 forms an inlay or embedded layer within lid body array 600, e.g., a polymer lid array.

Figure 15:
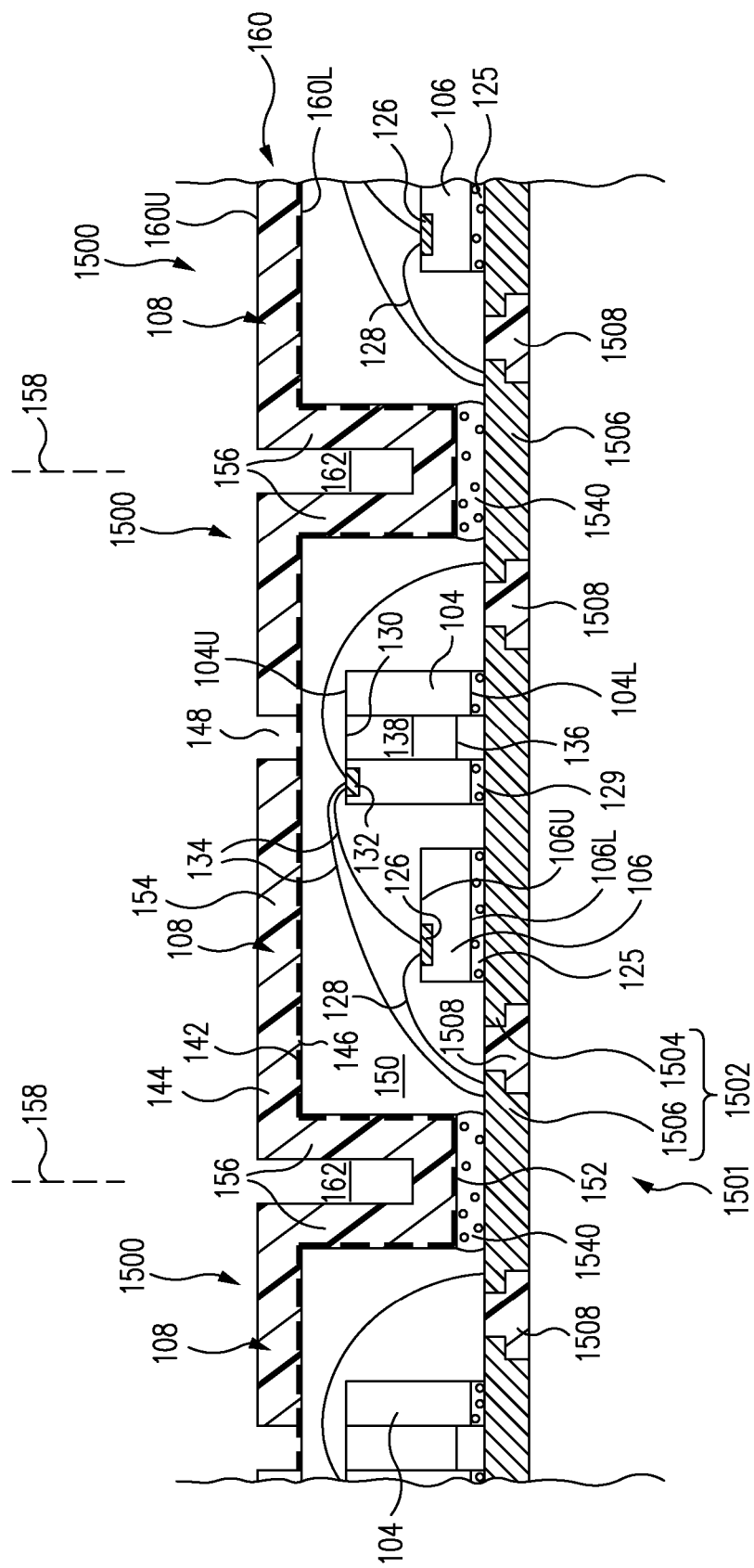
FIG. 15 is a cross-sectional view of an array of metal mesh lid leadframe MEMS packages during fabrication in accordance with another embodiment.

FIG. 15 is a cross-sectional view of an array 1501 of metal mesh lid leadframe MEMS packages 1500 during fabrication in accordance with another embodiment. Array 1501 of FIG. 15 is similar to array 101 of FIG. 1 except that array 1501 of FIG. 15 is formed with leadframes 1502 instead of substrates 102 of array 101 of FIG. 1 as discussed further below.

Referring now to FIG. 15, in accordance with this embodiment, each metal mesh lid leadframe MEMS package 1500 includes a leadframe 1502, MEMS electronic component 104, converter electronic component 106, and metal mesh lid 108. For simplicity, a single metal mesh lid leadframe MEMS package 1500 is described below and those of skill in the art will understand that the description is equally applicable to all of the metal mesh lid leadframe MEMS packages 1500 of array 1501.

Leadframe 1502 includes a die paddle 1504, leads 1506, and a mold compound 1508. Die paddle 1504 and leads 1506 are formed of an electrically conductive material, e.g., copper, plated copper, or other electrically conductive material. Mold compound 1508 is a dielectric material that holds die paddle 1504 and leads 1506 together.

Lower surface 106L of converter electronic component 106 is mounted to die paddle 1504 of leadframe 1502 with adhesive 125. Bond pads 126 of converter electronic component 106 are electrically connected to respective leads 1506 of leadframe 1502 with bond wires 128.

Lower surface 104L of MEMS electronic component 104 is mounted to die paddle 1504 of leadframe 1502 with adhesive 129. Bond pads 132 are electrically connected to respective leads 1506 of leadframe 1502 and/or respective one or more bond pads 126 of converter electronic component 106 with bond wires 134.

MEMS electronic component 104 and converter electronic component 106 are enclosed within metal mesh lid 108. More particularly, metal mesh lid 108 is mounted to leads 1506 and mold compound 1508 of leadframe 1502 with a lid adhesive 1540. Lid adhesive 1540 is a dielectric material in one embodiment to prevent shorting of metal mesh lid 108 with leads 1506. However, in another embodiment, one or more electrical connections are formed between metal mesh lid 108 and leads 1506, e.g., by selective application of an electrically conductive material such as epoxy.

After fabrication of the plurality of metal mesh lid leadframe MEMS packages 1500, array 1501 is singulated along singulation streets 158, e.g., using a saw, laser, or other singulation technique, to form a plurality of individual metal mesh lid leadframe MEMS packages 1500. Accordingly, leads 1506 do not project outward beyond the sides of metal mesh lid leadframe MEMS packages 1500 in this embodiment.

Figure 16:
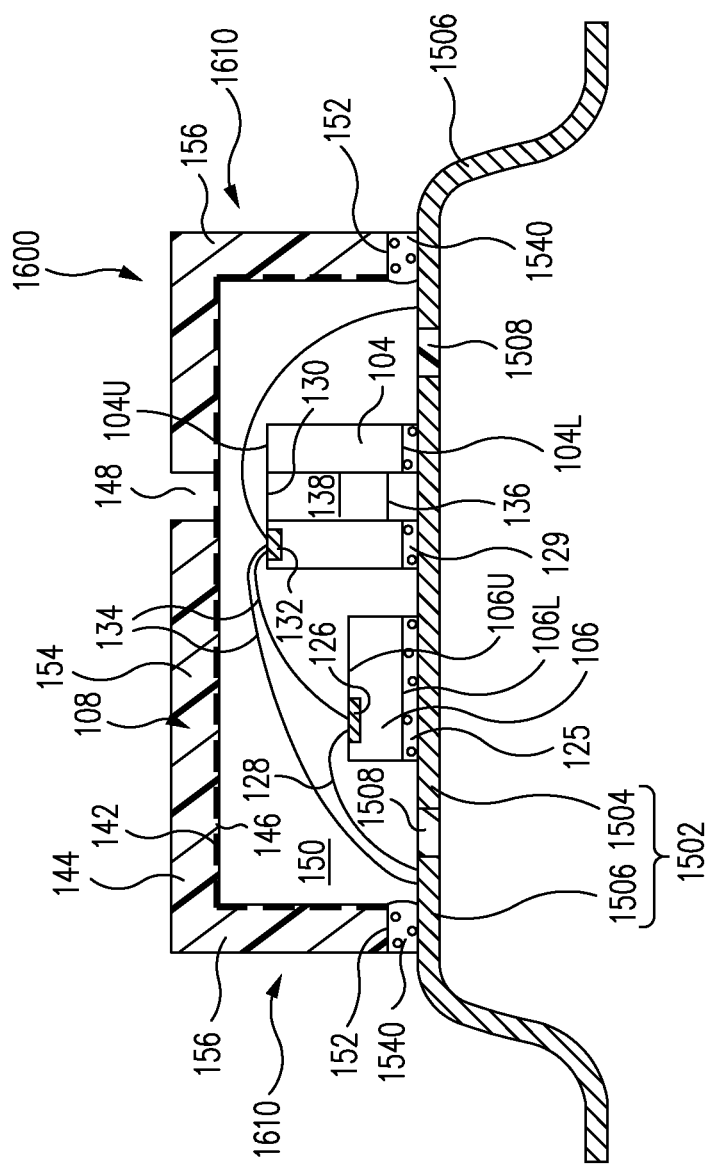
FIG. 16 is a cross-sectional view of a metal mesh lid leadframe MEMS package in accordance with yet another embodiment.

FIG. 16 is a cross-sectional view of a metal mesh lid leadframe MEMS package 1600 in accordance with yet another embodiment. Metal mesh lid leadframe MEMS package 1600 of FIG. 16 is similar to metal mesh lid leadframe MEMS package 1500 of FIG. 15 except that leads 1506 project outwards past sides 1610 of metal mesh lid leadframe MEMS package 1600 of FIG. 16.

Further, in accordance with one embodiment, metal mesh lid 108 is mounted to leadframe 1502 individually, e.g., after singulation from a metal mesh lid array such as any one of those described above.

Although specific embodiments were described herein, the scope of the invention is not limited to those specific embodiments. Numerous variations, whether explicitly given in the specification or not, such as differences in structure, dimension, and use of material, are possible. The scope of the invention is at least as broad as given by the following claims.

What is claimed is:
1. A structure comprising:
a substrate;
a Micro Electro Mechanical Systems (MEMS) electronic component coupled to the substrate; and
a metal mesh lid coupled to the substrate, the metal mesh lid comprising:
a polymeric lid body having a top port formed therein; and
a metal mesh cap embedded within the polymeric lid body, wherein the metal mesh cap covers the top port such that air may flow through the top port.
2. The structure of claim 1 wherein the metal mesh lid further comprises: a lid plate parallel to the substrate; and
lid sidewalls extending perpendicularly from the lid plate and terminating at a lid base of the metal mesh lid.
3. The structure of claim 2 wherein the metal mesh cap is exposed from the polymeric lid body at the lid base.
4. The structure of claim 1 wherein the metal mesh cap comprises connected strands of electrically conductive material.

5. The structure of claim 4 wherein the metal mesh cap comprises holes therein through which external stimulus can pass.

6. The structure of claim 5 wherein the polymeric lid body seals the holes of the metal mesh cap.

7. The structure of claim 1 wherein the metal mesh cap forms a filtration structure that prevents contaminants from passing through the top port.

8. The structure of claim 1 further comprising a lid adhesive coupling the metal mesh lid to the substrate, wherein the metal mesh cap forms a locking feature for the lid adhesive.

9. The structure of claim 1 further comprising an electrically conductive lid adhesive coupling the metal mesh cap to ground terminals of the substrate.

10. A structure comprising:
   a metal mesh lid array comprising:
      a polymeric lid body array comprising lid bodies having top ports formed therein; and
      a metal mesh cap array embedded within the polymeric lid body array, wherein metal mesh caps of the metal mesh cap array cover the top ports such that air may flow through the top ports.

11. The structure of claim 10 wherein the polymeric lid body array further exists between an inner surface of the polymeric lid body array and the metal mesh cap array.

12. The structure of claim 10 further comprising: substrates coupled to the metal mesh lid array.

13. The structure of claim 12 further comprising Micro Electro Mechanical Systems (MEMS) electronic components coupled to the substrates.

14. The structure of claim 12 wherein the metal mesh lid array further comprises:
   lid plates parallel to the substrates; and
   lid sidewalls extending perpendicularly from the lid plates and terminating at lid bases of the metal mesh lid array.

15. The structure of claim 14 wherein the metal mesh cap array is exposed from the polymeric lid body array at the lid bases.

16. The structure of claim 14 further comprising a lid adhesive coupling the lid bases to the substrates.

17. The structure of claim 16 wherein the lid adhesive is electrically conductive.

18. A method comprising:
   forming a metal mesh cap array comprising metal mesh caps; and
   embedding the metal mesh cap array within a polymeric lid body array to form a metal mesh lid array, the polymeric lid body array comprising lid bodies having top ports formed therein, wherein the metal mesh caps cover the top ports such that air may flow through the to ports.

19. The method of claim 18 wherein the embedding comprises: molding the polymeric lid body array to the metal mesh cap array.

20. The method of claim 18 wherein the polymeric lid body array further exists between an inner surface of the polymeric lid body array and the metal mesh cap array.

* * * * *